United States Patent
Takebayashi et al.

(10) Patent No.: US 11,299,804 B2
(45) Date of Patent: Apr. 12, 2022

(54) METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Yuji Takebayashi, Toyama (JP); Kosuke Takagi, Toyama (JP); Atsushi Hirano, Toyama (JP); Ryuichi Nakagawa, Toyama (JP); Noriyuki Isobe, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 253 days.

(21) Appl. No.: 16/554,243

(22) Filed: Aug. 28, 2019

(65) Prior Publication Data

US 2020/0095676 A1 Mar. 26, 2020

(30) Foreign Application Priority Data

Sep. 26, 2018 (JP) .............................. JP2018-180801

(51) Int. Cl.
*H01L 21/67* (2006.01)
*C23C 16/44* (2006.01)
(Continued)

(52) U.S. Cl.
CPC ........ *C23C 16/4402* (2013.01); *C23C 16/403* (2013.01); *C23C 16/4408* (2013.01);
(Continued)

(58) Field of Classification Search
None
See application file for complete search history.

(56) References Cited

U.S. PATENT DOCUMENTS

| 11,020,760 B2 * | 6/2021 | Fujino ................. C23C 16/4401 |
| 2008/0066677 A1 | 3/2008 | Morozumi et al. |

(Continued)

FOREIGN PATENT DOCUMENTS

| CN | 107086189 A | 8/2017 |
| JP | 2014-67877 A | 4/2014 |

(Continued)

OTHER PUBLICATIONS

Office Action in corresponding Korean Patent Application No. 10-2019-0104788, dated Jul. 20, 2020, with English translation.
(Continued)

*Primary Examiner* — Jack S Chen
(74) *Attorney, Agent, or Firm* — Edell, Shapiro & Finnan, LLC

(57) ABSTRACT

Described herein is a technique capable of suppressing deposits. According to one aspect of the technique, there is provided a method including: (a) supplying a source gas into a process chamber through a source gas nozzle while heating the process chamber; and (b) supplying a reactive gas into the process chamber, wherein (a) and (b) are alternately performed one by one to form a film on the plurality of the substrates while satisfying conditions including: (i) a supply time of the source gas in (a) in each cycle is 20 seconds or less; (ii) a pressure of the source gas in the source gas nozzle in (a) is 50 Pa or less; (iii) an inner temperature of the process chamber in (a) is 500° C. or less; and (iv) number of cycles performed continuously to form the film on the plurality of the substrates is 100 cycles or less.

9 Claims, 9 Drawing Sheets

| PROCESSING CONDITIONS | |
|---|---|
| SUPPLY TIME OF SOURCE GAS IN SOURCE GAS SUPPLYING STEP OF EACH CYCLE | 20 seconds or less |
| PRESSURE OF SOURCE GAS IN SOURCE GAS NOZZLE IN SOURCE GAS SUPPLYING STEP | 50 Pa or less |
| INNER TEMPERATURE OF PROCESS CHAMBER IN SOURCE GAS SUPPLYING STEP | 500 °C or less |
| THE NUMBER OF CYCLES PERFORMED CONTINUOUSLY | 100 cycles or less |
| THE NUMBER OF TIMES THAT SUBSTRATE PROCESSING IS PERFORMED CONTINUOUSLY | 4 or less |

(51) Int. Cl.
    *C23C 16/52*         (2006.01)
    *C23C 16/46*         (2006.01)
    *C23C 16/455*       (2006.01)
    *H01L 21/02*         (2006.01)
    *C23C 16/40*         (2006.01)

(52) U.S. Cl.
    CPC ........ *C23C 16/45597* (2013.01); *C23C 16/46* (2013.01); *C23C 16/52* (2013.01); *H01L 21/02178* (2013.01); *H01L 21/02271* (2013.01); *H01L 21/67248* (2013.01); *H01L 21/67253* (2013.01)

(56) References Cited

U.S. PATENT DOCUMENTS

| | | |
|---|---|---|
| 2014/0084389 A1 | 3/2014 | Ogawa |
| 2017/0232457 A1 | 8/2017 | Fujino et al. |
| 2020/0095676 A1* | 3/2020 | Takebayashi ........... C23C 16/20 |

FOREIGN PATENT DOCUMENTS

| | | |
|---|---|---|
| JP | 2017-147262 A | 8/2017 |
| KR | 10-2007-0113146 A | 11/2007 |

OTHER PUBLICATIONS

Office action in corresponding Chinese patent application No. 201910865389.9, dated Jul. 5, 2021, with English translation.

\* cited by examiner

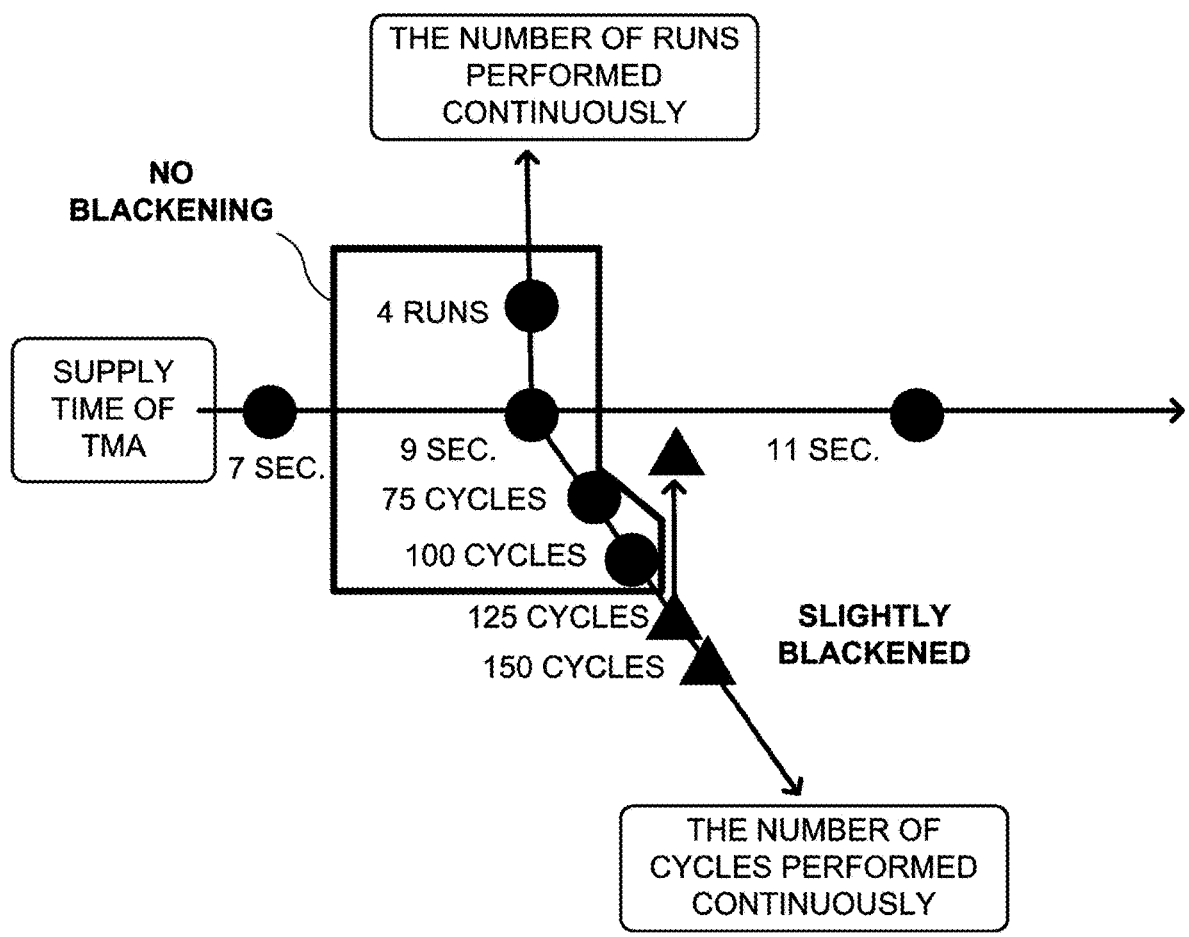

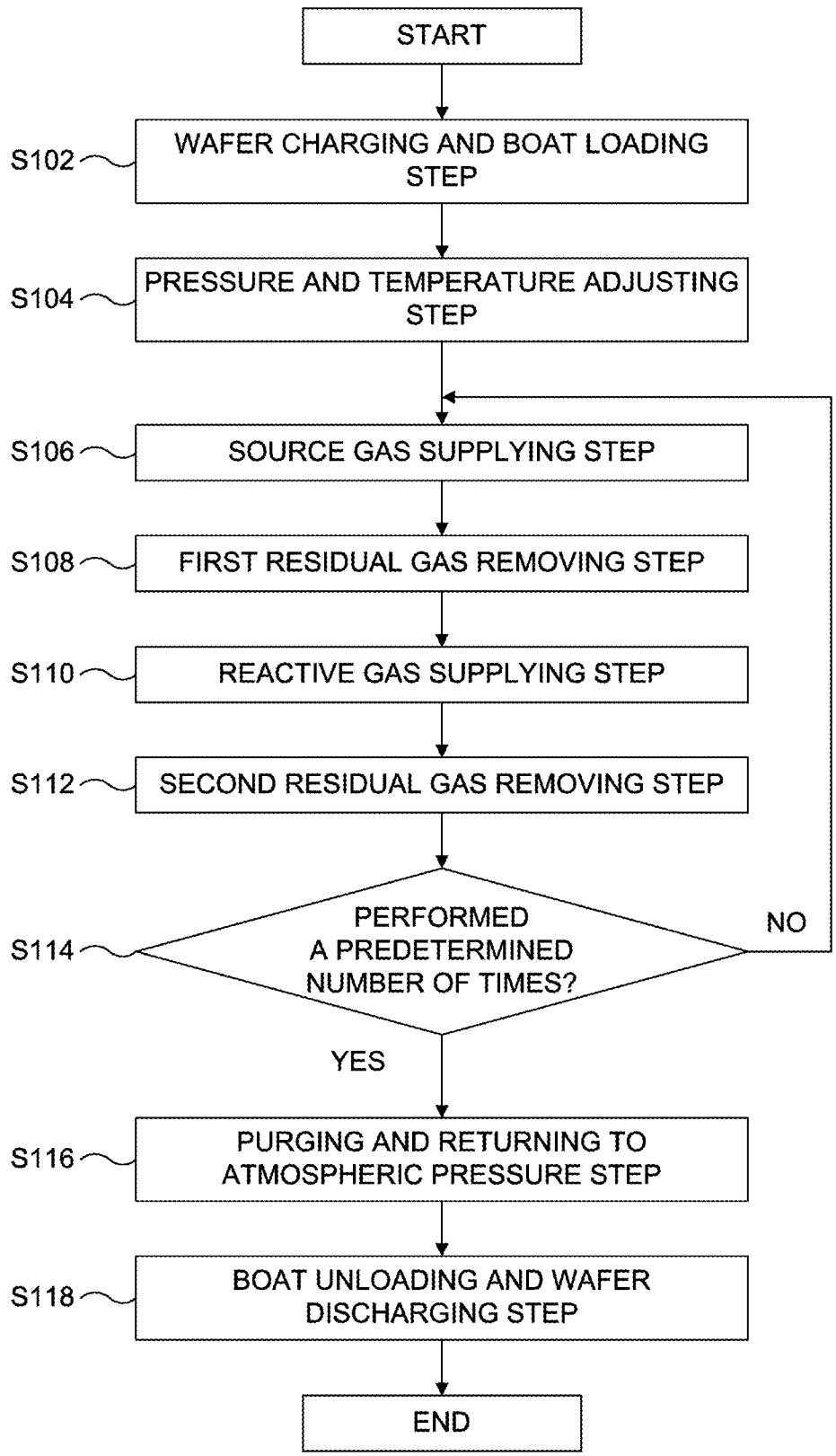

FIG. 10

| PROCESSING CONDITIONS | |
|---|---|
| SUPPLY TIME OF SOURCE GAS IN SOURCE GAS SUPPLYING STEP OF EACH CYCLE | 20 seconds or less |
| PRESSURE OF SOURCE GAS IN SOURCE GAS NOZZLE IN SOURCE GAS SUPPLYING STEP | 50 Pa or less |
| INNER TEMPERATURE OF PROCESS CHAMBER IN SOURCE GAS SUPPLYING STEP | 500 °C or less |
| THE NUMBER OF CYCLES PERFORMED CONTINUOUSLY | 100 cycles or less |
| THE NUMBER OF TIMES THAT SUBSTRATE PROCESSING IS PERFORMED CONTINUOUSLY | 4 or less |

METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS REFERENCE TO RELATED APPLICATIONS

This application claims foreign priority under 35 U.S.C. § 119(a)-(d) to Application No. JP 2018-180801 filed on Sep. 26, 2018, the entire contents of which are hereby incorporated by reference.

TECHNICAL FIELD

The present disclosure relates to a method of manufacturing a semiconductor device, a non-transitory computer-readable recording medium and a substrate processing apparatus.

BACKGROUND

As one of manufacturing processes of a semiconductor device, a film-forming process of forming a film on a substrate accommodated in a process chamber may be performed.

The film-forming process may be performed by using a vertical type apparatus configured to supply a gas (or gases) such as a source gas through a nozzle with a long length (also referred to as a "long nozzle"). When the film-forming process is performed by supplying the gas through the long nozzle into the process chamber in which a plurality of substrates including the substrate is accommodated (loaded), the gas used for the film-forming process may be thermally decomposed in the long nozzle, and deposits generated by decomposing the gas may adhere to an inner wall of the long nozzle. As a result, maintenance operations such as a cleaning operation and a replacement operation of the long nozzle may be required. In addition, when the deposits adhered in the long nozzle are peeled off during the film-forming process to generate particles (that is, to generate dusts), the particles may be diffused onto the substrate accommodated in the process chamber and may be added into the film as impurities.

SUMMARY

Described herein is a technique capable of suppressing deposits, generated by decomposing a gas such as a source gas and a reactive gas, from adhering to an inner wall of a nozzle through which the source gas is supplied when the source gas and the reactive gas are alternately supplied to a plurality of substrates to form a film thereon.

According to one aspect of the technique of the present disclosure, there is provided a method of manufacturing a semiconductor device including: (a) supplying a source gas into a process chamber through a source gas nozzle while heating the process chamber in which a plurality of substrates is stacked, wherein the source gas nozzle extends along a stacking direction of the plurality of the substrates and is provided with a plurality of gas supply holes opened at positions corresponding to a stacking region of the plurality of the substrates; and (b) supplying a reactive gas capable of reacting with the source gas into the process chamber, wherein a cycle, in which (a) and (b) are alternately performed one by one, is performed once or more to form a film on the plurality of the substrates while satisfying conditions including: (i) a supply time of the source gas in (a) in each cycle is 20 seconds or less; (ii) a pressure of the source gas in the source gas nozzle in (a) is 50 Pa or less; (iii) an inner temperature of the process chamber in (a) is 500° C. or less; and (iv) number of cycles performed continuously to form the film on the plurality of the substrates is 100 cycles or less.

BRIEF DESCRIPTION OF THE DRAWINGS

FIG. 8 schematically illustrates a relationship between the supply time of the source gas in the source gas supplying step, the number of cycles performed continuously, the number of times that a substrate processing is performed continuously and the blackening of the inner wall of the source gas nozzle due to the deposits.

FIG. 9 is a flow chart schematically illustrating the substrate processing according to the embodiments described herein.

FIG. 10 schematically illustrates processing conditions of the substrate processing according to the embodiments described herein.

DETAILED DESCRIPTION

Embodiments

Figure 1:
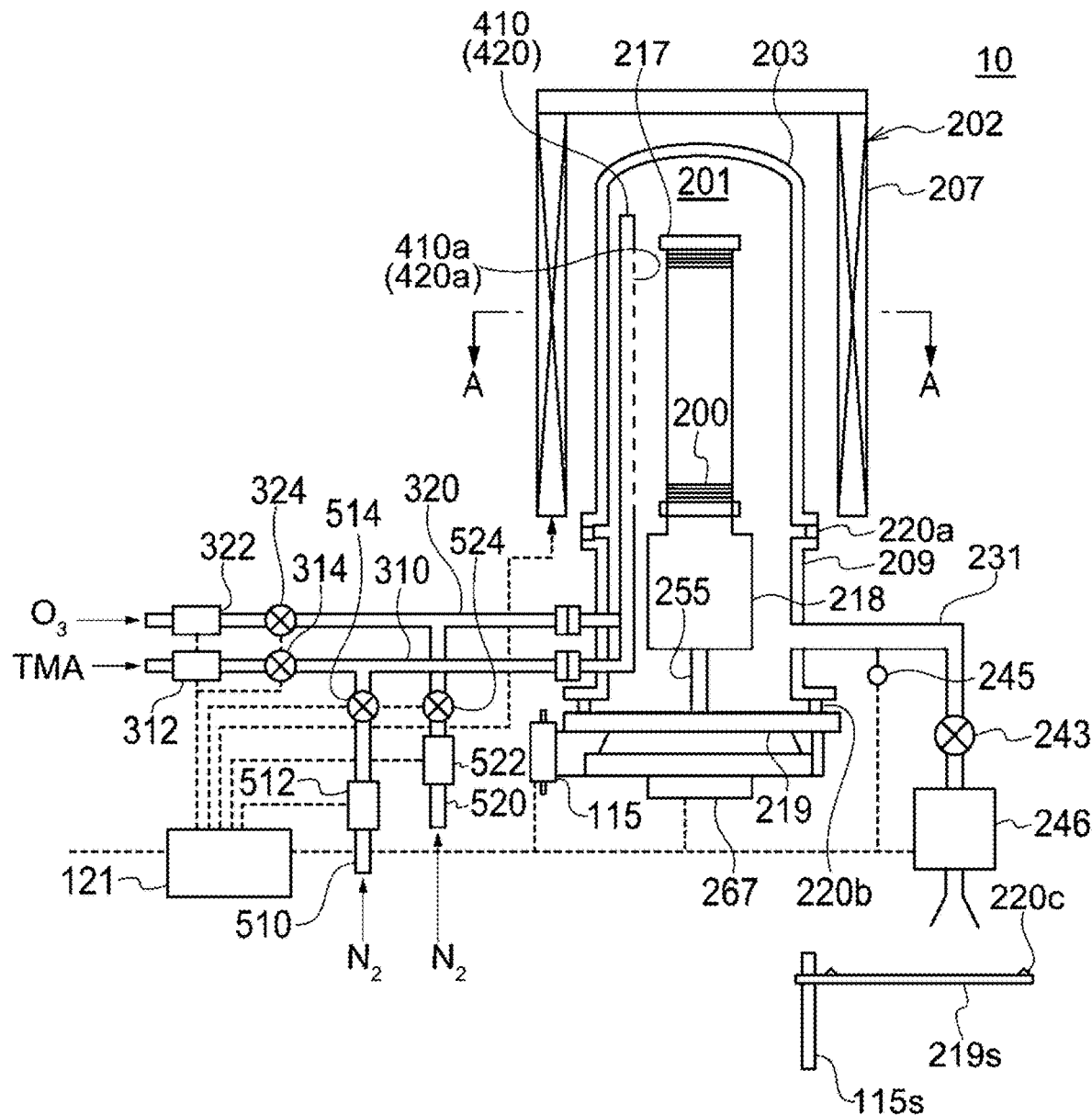
FIG. 1 schematically illustrates a vertical cross-section of a vertical type process furnace of a substrate processing apparatus preferably used in a first embodiment described herein.

Hereinafter, one or more embodiments (hereinafter, simply referred to as "embodiments") according to the technique of the present disclosure will be described with reference to the drawings. In the present specification, a numerical range represented by using "from A to B" includes A and B as a lower limit and an upper limit, respectively, of the numerical range. For example, a numerical range of a flow rate "from 10 sccm to 500 sccm" means a range equal to or more than 10 sccm and equal to or less than 500 sccm. That is, the numerical range "from 10 sccm to 500 sccm" includes 10 sccm as a lower limit and 500 sccm as an upper limit. The same also applies to all numerical ranges of parameters described herein such as a pressure, a time (time duration) and a temperature. In addition, the term "step" or "process" in the present specification is not limited to an independent step (or process), and may be referred to as a step (or process) as long as the step (or process) is performed to achieve an intended purpose of the step (or process) even when the step (or process) cannot be clearly distinguished from other steps.

When a film is formed on a substrate by alternately supplying a source gas and a reactive gas reacting with the source gas to the substrate, for example, a substrate processing apparatus capable of simultaneously processing a plurality of substrates including the substrate may be used. The substrate processing apparatus is configured to accommodate the plurality of the substrates supported by a substrate retainer (also referred to as a "substrate support"), and includes a nozzle with a long length (also referred to as a "long nozzle") extending from a lower region to an upper region of a process chamber of the substrate processing apparatus along a stacking direction of the plurality of the substrates. The nozzle is provided with a plurality of gas supply holes opened to eject a gas such as the source gas respectively to the plurality of the substrates. However, when a film-forming process is performed using the substrate processing apparatus described above, in general the process chamber is maintained at a high temperature to enhance the reactivity of the gas. Therefore, the self-decomposition of the gas proceeds even in the nozzle, and deposits may easily adhere to an inner wall of the nozzle. In addition, in the nozzle (also referred to as a "multi-hole nozzle" or a "porous nozzle") provided with the plurality of the gas supply holes, a pressure becomes higher toward an upstream side (that is, a lower portion) of the nozzle, so that the self-decomposition of the gas may easily occur. When the deposits generated by decomposing the gas adhere to the inner wall of the nozzle, the inner wall of the nozzle is blackened. As a result, maintenance operations such as cleaning and replacing the nozzle may be required. In addition, the deposits on the inner wall of the nozzle may be peeled off during performing a cycle of the film-forming process depending on the adhesion of the deposits. When the deposits on the inner wall of the nozzle are peeled off during the film-forming process to generate particles (that is, to generate dusts), the particles may be supplied onto the substrate accommodated in the process chamber and may be added into the film as impurities. Therefore, it may be necessary to take measures against the deposits adhering to the inner wall of the nozzle (that is, measures against a source generating the dusts in the nozzle).

As a result of intensive research on the cause of the deposits adhering to the inner wall of the nozzle, the disclosers of the present application have discovered that the decomposition of the source gas and the adhesion of the deposits to the inner wall of the nozzle are greatly affected by conditions such as a supply time of the source gas in a source gas supplying step in each cycle of the film-forming process, a pressure of the source gas in a source gas nozzle (that is, the nozzle) in the source gas supplying step, the number of cycles performed continuously to form the film on the substrate and an inner temperature of the process chamber. Then, based on repeated experiments and discussions on conditions under which the deposits generated by the self-decomposition of the source gas can be suppressed from adhering to the inner wall of the nozzle, the disclosers of the present application have achieved the technique of the present disclosure.

Configuration of Substrate Processing Apparatus

An example of a substrate processing apparatus preferably used to implement a method of manufacturing a semiconductor device according to the embodiments will be described. In the following description, the example of the substrate processing apparatus according to the embodiments will be described with reference to FIGS. 1 through 3. In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or a film formed on a wafer". In the present specification, the term "substrate" and "wafer" may be used as substantially the same meaning. That is, the term "substrate" may be substituted by "wafer" and vice versa.

First Embodiment

FIG. 1 schematically illustrates an exemplary configuration of a substrate processing apparatus 10 preferably used to implement the method of manufacturing the semiconductor device according to the embodiments including a first embodiment. The substrate processing apparatus 10 may include: a process chamber 201 configured to accommodate a plurality of wafers including a wafer 200; a heater 207 serving as a heating apparatus and configured to heat an inside of the process chamber 201; a gas supply pipe 310 serving as a part of a source gas supply mechanism and configured to supply the source gas into the process chamber 201; a nozzle 410 provided with a plurality of gas supply holes 410a; a gas supply pipe 320 serving as a part of a reactive gas supply mechanism and configured to supply the reactive gas into the process chamber 201; a nozzle 420 provided with a plurality of gas supply holes 420a; and a controller 121 serving as a control mechanism (or control device) and configured to control parameters such as a temperature heated by the heater 207, species of gases supplied through the plurality of the gas supply holes 410a and the plurality of the gas supply holes 420a, respectively, amounts (also referred to as "supply amounts") of the gases (or flow rates of the gases) supplied through the plurality of the gas supply holes 410a and the plurality of the gas supply holes 420a, respectively, supply times (also referred to as "time durations") of the gases, the number of cycles performed continuously to form a film on the wafer 200 in one batch process (also simply referred to as the number of continuous cycles) and the number of times of a substrate processing performed continuously (also simply referred to as the number of continuous substrate processing).

As shown in FIG. 1, a process furnace (vertical type process furnace) 202 of the substrate processing apparatus 10 includes a heater 207 serving as a heating device (temperature adjusting mechanism). The heater 207 is of a cylindrical shape, and is vertically installed while being supported by a heater base (not shown) serving as a support plate. The heater 207 is configured to heat the inside of the process chamber 201 described later at a predetermined temperature. The heater 207 also functions as an activation mechanism (excitation mechanism) for activating (exciting) a gas such as the source gas and the reactive gas by heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with an open lower end and a closed upper end. A manifold (also referred to as an "inlet flange") 209 is provided under the reaction tube 203 to be aligned in a manner concentric with the reaction tube 203. The manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a sealing part (also referred to as a "sealing member") is provided between the manifold 209 and the reaction tube 203. As the manifold 209 is supported by the heater base, the he reaction tube 203 is installed vertically. A process vessel (also referred to as a "reaction vessel") is constituted mainly by the reaction tube 203 and the manifold 209. The process chamber 201 is provided in a hollow cylindrical portion of the process vessel. The process chamber 201 is configured to accommodate the plurality of the wafers including the wafer 200 serving as a substrate vertically in a horizontal orientation in a multistage manner by a boat 217 described later.

The nozzles 410 and 420 are provided in the process chamber 201 so as to penetrate a side wall of the manifold 209. The gas supply pipes 310 and 320 serving as gas supply lines are connected to the nozzles 410 and 420, respectively. For example, the number of nozzles may be changed appropriately as necessary.

Mass flow controllers (MFCs) 312 and 322 serving as flow rate controllers (flow rate control mechanisms) and valves 314 and 324 serving as opening/closing valves are sequentially installed at the gas supply pipes 310 and 320, respectively, from upstream sides to downstream sides of the gas supply pipes 310 and 320. Gas supply pipes 510 and 520 configured to supply an inert gas are connected to the gas supply pipes 310 and 320 at downstream sides of the valves 314 and 324 of the gas supply pipes 310 and 320, respectively. MFCs 512 and 522 and valves 514 and 524 are sequentially installed at the gas supply pipes 510 and 520, respectively, from upstream sides to downstream sides of the gas supply pipes 510 and 520.

Figure 2:
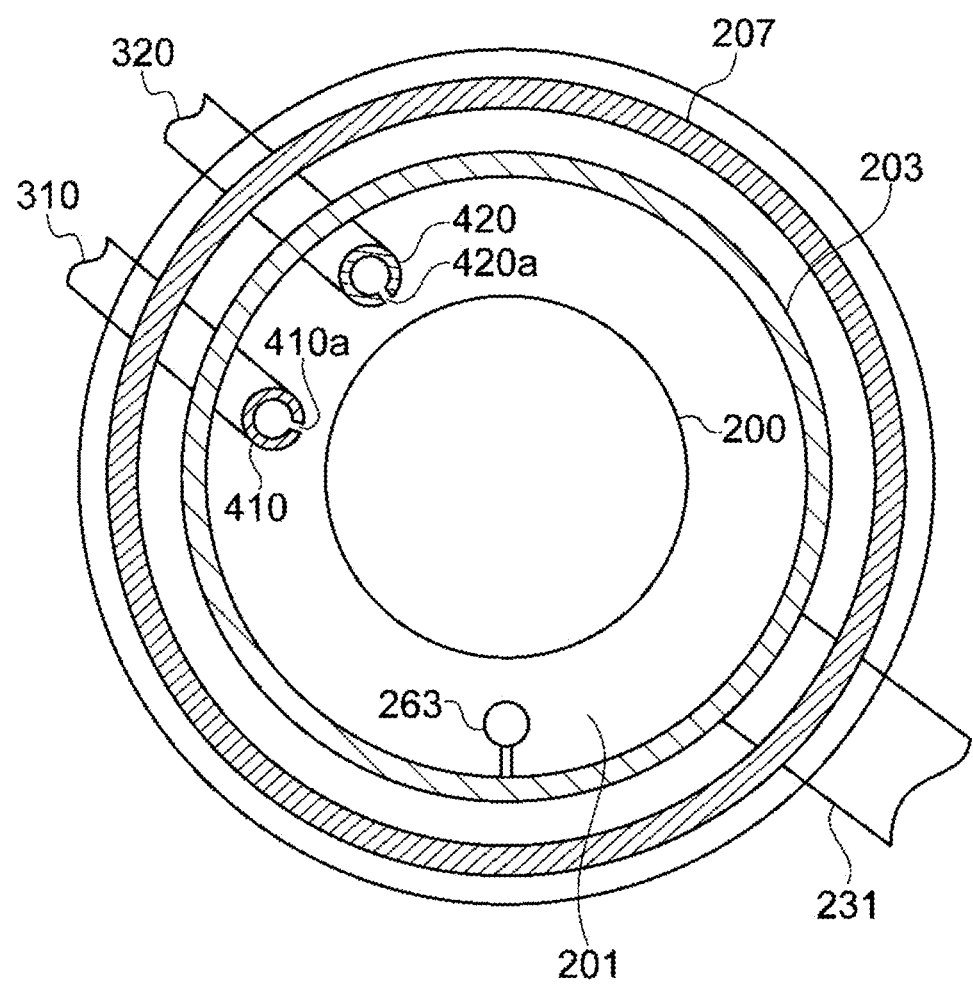
FIG. 2 schematically illustrates a cross-section taken along the line A-A of the vertical type process furnace of the substrate processing apparatus preferably used in the first embodiment shown in FIG. 1.

The nozzles 410 and 420 are connected to front ends of the gas supply pipes 310 and 320, respectively. Although only the nozzle 410 is shown in FIG. 1 for convenience, the two nozzles 410 and 420 are actually provided as shown in FIG. 2. The nozzles 410 and 420 may include L-shaped nozzles. Horizontal portions of the nozzles 410 and 420 are installed through the side wall of the manifold 209. Vertical portions of the nozzles 410 and 420 are installed in an annular space between an inner wall of the reaction tube 203 and the plurality of the wafers including the wafer 200 accommodated in the process chamber 201 when viewed from above, and extend from a lower portion of the inner wall of the reaction tube 203 to an upper portion of the inner wall of the reaction tube 203 along a stacking direction of the plurality of the wafers, respectively.

The nozzles 410 and 420 are provided to extend from a lower region to an upper region of the process chamber 201. The plurality of the gas supply holes (also referred to as "source gas supply holes") 410a and the plurality of the gas supply holes 420a (also referred to as "reactive gas supply holes"), which are configured to supply the gas such as the source gas and the reactive gas, are provided at the nozzles 410 and 420 at positions facing the plurality of the wafers including the wafer 200. As shown in FIG. 2, the plurality of the gas supply holes 410a and the plurality of the gas supply holes 420a are open toward the center of the reaction tube 203, and are configured to supply the gas toward the plurality of the wafers accommodated in the process chamber 201 and supported by (that is, stacked in) the boat 217.

The plurality of the gas supply holes 410a has the same area and pitch, and the plurality of the gas supply holes 420a has the same opening area and pitch. However, the plurality of the gas supply holes 420a is not limited thereto. For example, the opening area of the plurality of the gas supply holes 420a may gradually increase from a lower portion (upstream side) toward an upper portion (downstream side) of the nozzle 420 to further uniformize a flow rate of the gas supplied through the plurality of the gas supply holes 420a.

According to the embodiments, the gases is supplied through the nozzles 410 and 420 provided in the vertical annular space (that is, a cylindrical space) defined by an inner surface of the side wall (that is, the inner wall) of the reaction tube 203 and the edge portions (peripheral portions) of the plurality of the wafers including the wafer 200 arranged in the reaction tube 203. The gases are ejected into the reaction tube 203 in the vicinity of the plurality of the wafers including the wafer 200 through the plurality of the gas supply holes 410a and the plurality of the gas supply holes 420a of the nozzles 410 and 420, respectively. The gases ejected into the reaction tube 203 mainly flow parallel to the surfaces of the plurality of the wafers, that is, in a horizontal direction.

According to the configurations of components such as the nozzles 410 and 420, the plurality of the gas supply holes 410a and the plurality of the gas supply holes 420a, it is possible to uniformly supply the gases to each of the plurality of the wafers including the wafer 200 and to improve a thickness uniformity of the film formed on the plurality of the wafers between the plurality of the wafers.

The source gas containing a metal element (also referred to as a "metal-containing gas"), which is one of process gases and supplied through the gas supply pipe 310, is supplied into the process chamber 201 through the gas supply pipe 310 provided with the MFC 312 and the valve 314, the nozzle 410 and the plurality of the gas supply holes 410a. For example, a metal-containing gas containing aluminum (Al) which is a metal element such as an aluminum-containing source material (also referred to as an "Al-containing source gas" or an "Al-containing gas") may be used as the source gas. For example, trimethylaluminum ($Al(CH_3)_3$, abbreviated as TMA) gas may be used as the Al-containing source gas. The TMA gas is an organic-based source gas, and is an alkylaluminum in which an alkyl group is bonded to aluminum as a ligand. In the present specification, the nozzle 410 may also be referred to as a "source gas nozzle".

In the present specification, the term "source gas" may refer to a source material in a gaseous state under the normal temperature and the normal pressure (also referred to as the atmospheric pressure) or a gas obtained by vaporizing a source material in a liquid state under the normal temperature and the normal pressure. In the present specification, the term "source material" may indicate only "source material in a liquid state", may indicate only "source material (source gas) in a gaseous state" and may indicate both of "source material in the liquid state" and "source material in the gaseous state".

When the source gas which is self-decomposed at a predetermined temperature is supplied through the gas supply pipe 310, a source gas supply system (also referred to as a "source gas supply mechanism") is constituted mainly by the gas supply pipe 310, the MFC 312 and the valve 314. The source gas supply system may further include the nozzle 410.

The reactive gas, which is one of process gases and supplied through the gas supply pipe 320, is supplied into the process chamber 201 through the gas supply pipe 320 provided with the MFC 322 and the valve 324, the nozzle 420 and the plurality of the gas supply holes 420a. The reactive gas has a different chemical structure (molecular structure) from that of the source gas. For example, an oxygen-containing gas (also referred to as an "oxidizing gas" or an "oxidizing agent") may be used as the reactive gas (also referred to as a "reactant") containing oxygen (O) and reacting with aluminum (Al). For example, ozone ($O_3$) gas may be used as the oxygen-containing gas (that is, the reactive gas).

When the reactive gas (reactant) is supplied through the gas supply pipe 320, a reactive gas supply system (also referred to as a "reactive gas supply mechanism") is constituted mainly by the gas supply pipe 320, the MFC 322 and the valve 324. The reactive gas supply system may further include the nozzle 420. In the present specification, the nozzle 420 may also be referred to as a "reactive gas nozzle".

An inert gas such as nitrogen ($N_2$) gas is supplied into the process chamber 201 through the gas supply pipes 510 and 520 provided with the MFCs 512 and 522 and the valves 514 and 524, respectively, the gas supply pipes 310 and 320 and the nozzles 410 and 420.

An inert gas supply system (also referred to as an "inert gas supply mechanism") is constituted mainly by the gas supply pipes 510 and 520, the MFCs 512 and 522 and the valves 514 and 524.

The source gas supply system and the reactive gas supply system may be collectively referred to as a gas supply system (also referred to as a "gas supply mechanism"). The gas supply system may further include the inert gas supply system.

An exhaust pipe 231 serving as an exhaust flow path configured to exhaust an inner atmosphere of the process chamber 201 is provided at the reaction tube 203. A vacuum pump 246 serving as a vacuum exhaust apparatus is connected to the exhaust pipe 231 through a pressure sensor 245 and an APC (Automatic Pressure Controller) valve 243. The pressure sensor 245 serves as a pressure detector (pressure detection mechanism) to detect an inner pressure of the process chamber 201, and the APC valve 243 serves as an exhaust valve (pressure adjusting mechanism). With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted based on the pressure detected by the pressure sensor 245, in order to control (adjust) the inner pressure of the process chamber 201. An exhaust system (also referred to as an "exhaust mechanism") is constituted mainly by the exhaust pipe 231, the APC valve 243 and the pressure sensor 245. The exhaust system may further include the vacuum pump 246. The embodiments described herein are not limited to an example in which the exhaust pipe 231 is provided at the reaction tube 203. Similar to the components such as the nozzles 410 and 420 provided at the manifold 209 as shown in FIG. 1, the exhaust pipe 231 may be provided at the manifold 209 instead of the reaction tube 203.

A seal cap 219 serving as a furnace opening cover capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is disk-shaped. An O-ring 220b serving as a sealing part is provided on an upper surface of the seal cap 219 so as to be in contact with the lower end of the manifold 209. A rotating mechanism 267 configured to rotate the boat 217 is provided under the seal cap 219 opposite to the process chamber 201. A rotating shaft 255 of the rotating mechanism 267 is connected to the boat 217 through the seal cap 219. As the rotating mechanism 267 rotates the boat 217, the plurality of the wafers including the wafer 200 supported by the boat 219 is rotated. A boat elevator 115 serving as an elevating mechanism is provided outside the reaction tube 203 vertically. The seal cap 219 may be moved upward or downward in the vertical direction by the boat elevator 115. When the seal cap 219 is moved upward or downward by the boat elevator 115, the boat 217 placed on the seal cap 219 may be transferred (loaded) into the process chamber 201 or transferred (unloaded) out of the process chamber 201. The boat elevator 115 serves as a transfer device (also referred to as a "transfer mechanism") capable of loading the boat 217 (that is, the plurality of the wafers including the wafer 200 accommodated in the boat 217) into the process chamber 201 or unloading the boat 217 (that is, the plurality of the wafers including the wafer 200 accommodated in the boat 217) out of the process chamber 201. A shutter 219s serving as a furnace opening cover capable of airtightly sealing the lower end opening of the manifold 209 is provided under the manifold 209. The shutter 219s is configured to close the lower end opening of the manifold 209 when the seal cap 219 is lowered by the boat elevator 115. The shutter 219s is made of a metal such as SUS (stainless steel), and is disk-shaped. An O-ring 220c serving as a sealing part is provided on an upper surface of the shutter 219s so as to be in contact with the lower end of the manifold 209. The opening/closing operation of the shutter 219s such as an elevation operation and a rotation operation is controlled by a shutter opening/closing mechanism 115s.

The boat 217 serving as a substrate retainer is configured to align the plurality of the wafers including the wafer 200, for example, from 25 to 200 wafers in the vertical direction and configured to support the plurality of the wafers, while the plurality of the wafers is horizontally oriented with their centers aligned with each other. That is, the boat 217 supports (accommodates) the plurality of the wafers including the wafer 200 with predetermined intervals therebetween. The boat 217 is made of a heat resistant material such as quartz and SiC. Insulating plates (not shown) are provided in multiple stages under the boat 217. The insulating plates are made of a heat resistant material such as quartz and SiC. The insulating plates suppress the transmission of heat from the heater 207 to the seal cap 219. However, the embodiments are not limited thereto. For example, instead of the insulating plates, a heat insulating cylinder 218 may be provided as a cylindrical component made of a heat resistant material such as quartz and SiC.

As shown in FIG. 2, a temperature sensor 263 serving as a temperature detector is provided in the reaction tube 203. The state of electric conduction to the heater 207 is adjusted based on the temperature detected by the temperature sensor 263, such that the inner temperature of the process chamber 201 has a desired temperature distribution. Similar to the nozzles 410 and 420, the temperature sensor 263 is L-shaped and is provided along the inner wall of the reaction tube 203.

Figure 3:
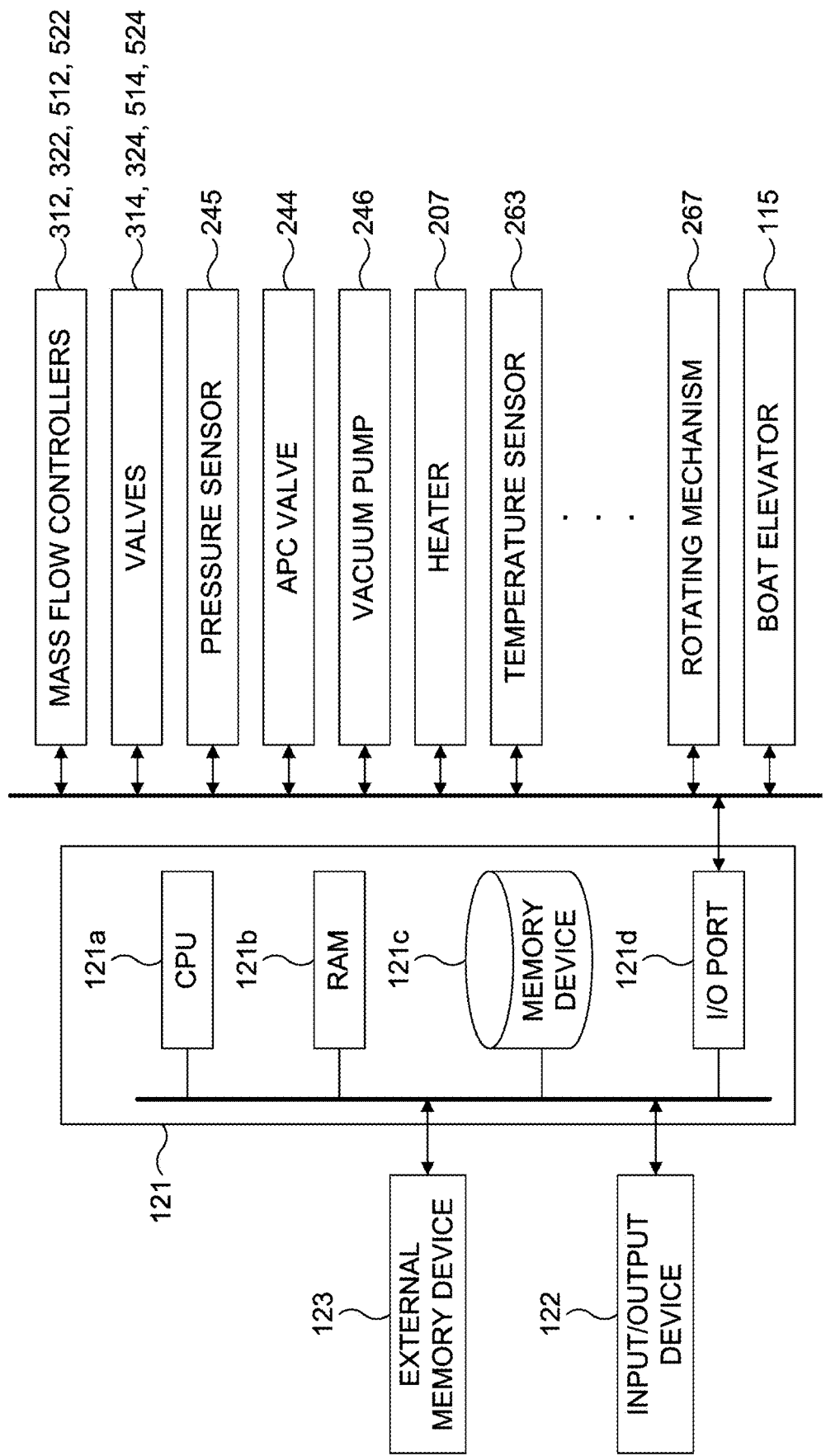
FIG. 3 is a block diagram schematically illustrating a configuration of a controller and related components of the substrate processing apparatus preferably used in the first embodiment described herein.

As shown in FIG. 3, the controller 121 serving as a control device (control mechanism) is constituted by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus. For example, an input/output device 122 such as a touch panel is connected to the controller 121.

The memory device 121c is configured by components such as a flash memory and a hard disk drive (HDD). For example, a control program for controlling the operation of the substrate processing apparatus 10 or a process recipe containing information on the sequences and conditions of a substrate processing (film-forming process) described later is readably stored in the memory device 121c. The process recipe is obtained by combining steps of the film-forming process (substrate processing) described later such that the controller 121 can execute the steps to acquire a predetermine result, and functions as a program. Hereafter, the process recipe, and the control program may be collectively or individually referred to as a "program". That is, in the present specification, the term "program" may indicate only the process recipe, may indicate only the control program, or may indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 512, 522, 312 and 322, the valves 514, 524, 314 and 324, the pressure sensor 245, the APC valve 243, the vacuum pump 246, the temperature sensor 263, the heater 207, the rotating mechanism 267, the boat elevator 115 and the shutter opening/closing mechanism 115s.

The CPU 121a is configured to read a control program from the memory device 121c and execute the read control program. In addition, the CPU 121a is configured to read a recipe from the memory device 121c according to an operation command inputted from the input/output device 122. According to the contents of the read recipe, the CPU 121a may be configured to control various operations such as flow rate adjusting operations for various gases by the MFCs 312, 322, 512 and 522, opening/closing operations of the valves 314, 324, 514 and 524, an opening/closing operation of the APC valve 243, a pressure adjusting operation by the APC valve 243 based on the pressure sensor 245, a start and stop of the vacuum pump 246, a temperature adjusting operation of the heater 207 based on the temperature sensor 263, an operation of adjusting rotation and rotation speed of the boat 217 by the rotating mechanism 267, an elevating and lowering operation of the boat 217 by the boat elevator 115 and an opening/closing operation of the shutter 219s by the shutter opening/closing mechanism 115s.

The controller 121 may be embodied by installing the above-described program stored in an external memory device 123 into a computer. For example, the external memory device 123 may include a magnetic tape, a magnetic disk such as a flexible disk and a hard disk, an optical disk such as a CD and a DVD, a magneto-optical disk such as MO and a semiconductor memory such as a USB memory and a memory card. The memory device 121c or the external memory device 123 may be embodied by a non-transitory computer readable recording medium. Hereafter, the memory device 121c and the external memory device 123 are collectively referred to as recording media. In the present specification, the term "recording media" may indicate only the memory device 121c, may indicate only the external memory device 123, and may indicate both of the memory device 121c and the external memory device 123. Instead of the external memory device 123, a communication means such as the Internet and a dedicated line may be used for providing the program to the computer.

Substrate Processing (Film-Forming Process)

Hereinafter, an example of the substrate processing (film-forming process) of forming a film on the wafer 200, which is a part of manufacturing processes of a semiconductor device, will be described with reference to FIG. 9. FIG. 9 is a flow chart schematically illustrating the substrate processing according to the embodiments described herein. Hereinafter, the components of the substrate processing apparatus 10 are controlled by the controller 121.

For example, a program that causes the substrate processing apparatus 10 to execute each step (sequence) of forming the film on the wafer 200 by the method of manufacturing the semiconductor device according to the embodiments is prepared. Then by performing a cycle of the program a predetermined number of times (n times), an aluminum oxide film (also referred to as an "AlO film") is formed on the wafer 200 as a film containing aluminum (Al) and oxygen (O). For example, the cycle includes: a source gas supplying step S106 of supplying the TMA gas serving as the source gas into the process chamber 201 through the plurality of the gas supply holes 410a opened at the nozzle 410 while heating the inside of the process chamber 201 by the heater 207 at a predetermined temperature; and a reactive gas supplying step S110 of supplying the $O_3$ gas serving as the reactive gas into the process chamber 201 through the plurality of the gas supply holes 420a opened at the nozzle 420. The plurality of the wafers including the wafer 200 serving as a substrate to be processed is accommodated in the process chamber 201 while supported by (stacked in) the boat 217. In the cycle, the source gas supplying step and the reactive gas supplying step are alternately performed one by one. The details will be described below.

Wafer Charging and Boat Loading Step S102

The plurality of the wafers including the wafer 200 is charged (transferred) into the boat 217. Then, as shown in FIG. 1, the boat 217 charged with the plurality of the wafers is elevated by the boat elevator 115 and loaded (transferred) into the process chamber 201 (boat loading step). With the boat 217 loaded, the seal cap 219 seals the lower end opening of the manifold 209 via the O-ring 220b.

Pressure and Temperature Adjusting Step S104

The vacuum pump 246 vacuum-exhausts the inner atmosphere of the process chamber 201 until the inner pressure of the process chamber 201 in which the plurality of the wafers including the wafer 200 is accommodated reaches a desired pressure (vacuum degree). In the pressure and temperature adjusting step S104, the inner pressure of the process chamber 201 is measured by the pressure sensor 245, and the APC valve 243 is feedback-controlled based on the measured pressure (pressure adjusting step). The vacuum pump 246 continuously vacuum-exhausts the inner atmosphere of the process chamber 201 until at least the processing of the wafer 200 is completed. The heater 207 heats the process chamber 201 until the inner temperature of the process chamber 201 reaches a desired temperature. The state of the electric conduction to the heater 207 is feedback-controlled based on the temperature detected by the temperature sensor 263 such that the inner temperature of the process chamber 201 has a desired temperature distribution (temperature adjusting step). The heater continuously heats the process chamber 201 until at least the processing of the wafer 200 is completed. Then, the rotating mechanism 267 rotates the plurality of the wafers including the wafer 200 by rotating the boat 217. The rotating mechanism 267 continuously rotates the boat 217 (that is, the plurality of the wafers) until at least the processing of the wafer 200 is completed.

Film-Forming Step

Thereafter, the film-forming step is performed by performing the cycle including the source gas supplying step (that is, a process of supplying the source gas) S106, a first residual gas removing step (that is, a process of removing a residual gas) S108, the reactive gas supplying step (that is, a process of supplying the reactive gas) S110 and a second residual gas removing step (that is, a process of removing a residual gas) S112 sequentially a predetermined number of times.

Source Gas Supplying Step S106

The valve 314 is opened to supply the TMA gas into the gas supply pipe 310. After the flow rate of the TMA gas is adjusted by the MFC 312, the TMA gas is supplied onto the plurality of the wafers including the wafer 200 through the plurality of the gas supply holes 410a opened at the nozzle 410. That is, the wafer 200 is exposed to the TMA gas. The TMA gas supplied through the plurality of the gas supply holes 410a passes through the inside of the process chamber 201, and is exhausted through the exhaust pipe 231. In the source gas supplying step S106, only the TMA gas serving as the source gas may be supplied into the gas supply pipe 310 and the nozzle 410 by opening only the valve 314. However, a mixed gas of the TMA gas and the $N_2$ gas serving as a carrier gas may be supplied into the nozzle 410 by further opening the valve 514 to supply the $N_2$ gas into the gas supply pipe 310. Hereinafter, exemplary process conditions of the source gas supplying step in each cycle will be described with reference to FIG. 10. FIG. 10 schematically illustrates the exemplary processing conditions of the substrate processing according to the embodiments described herein.

(i) Supply Time of the Source Gas in the Source Gas Supplying Step in each Cycle: 20 Seconds or Less When the TMA gas is supplied to the wafer 200 in the process chamber 201 through the plurality of the gas supply holes 410a of the nozzles 410 in the source gas supplying step S106, the supply time (also refer to as a "time duration") of the TMA gas in one cycle is limited to 20 seconds or less. By shortening the supply time of the source gas in one cycle, it is possible to shorten a residence time of the source gas in the nozzle 410, and it is also possible to eject the TMA gas out of the nozzle 410 before the TMA gas is self-decomposed. According to experiments performed by the disclosers of the present application, by suppressing the supply time of the source gas in the source gas supplying step S106 in each cycle within 20 seconds, it is possible to suppress the decomposed components of TMA molecules from combining (bonding) with each other and adhering to the inner wall of the nozzle 410. From the viewpoint of suppressing the decomposition and adhesion of the TMA gas to the inner wall of the nozzle 410, the supply time of the TMA gas in the source gas supplying step S106 in each cycle is set to, preferably 20 seconds or less, and more preferably 12 seconds or less. However, as the supply time of the TMA gas in one cycle is shortened, the number of the cycles required to form a film with a desired thickness on the wafer 200 is increased. As a result, the productivity may be reduced. Therefore, the supply time of the TMA gas in one cycle is set to, preferably 2 seconds or more, and more preferably 5 seconds or more.

(ii) Pressure of the Source Gas in the Source Gas Nozzle in the Source Gas Supplying Step: 50 Pa or Less When the TMA gas is supplied to the wafer 200 in the process chamber 201 through the plurality of the gas supply holes 410a of the nozzle (that is, the source gas nozzle) 410 in the source gas supplying step S106, the pressure of the source gas in the source gas nozzle 410 is limited to 50 Pa or less. In the present specification, "the pressure of the source gas in the source gas nozzle 410" may refer to "an inner pressure of the nozzle 410" when only the source gas is supplied into the source gas nozzle 410, and may refer to "a partial pressure of the source gas" when a mixed gas of the source gas and the inert gas are supplied into the source gas nozzle 410. In addition, when only the source gas is supplied into the source gas nozzle 410 or when the mixed gas of the source gas and the inert gas is supplied into the source gas nozzle 410, a maximum inner pressure of the nozzle 410 by the source gas is limited to 50 Pa or less. For example, when the sizes of the plurality of the gas supply holes 410a of the source gas nozzle 410 are all the same and provided at equal intervals, the inner pressure of the nozzle 410 is maximized at a lowermost portion of the nozzle 410. Hereinafter, the pressure of the source gas in the source gas nozzle 410 in the source gas supplying step S106 may also be referred to as a "source gas pressure in the nozzle 410" or a "TMA gas pressure in the nozzle 410".

Since the TMA gas stagnates in the nozzle 410, as time passes the TMA molecules are decomposed (that is, $CH_3$ is removed from the TMA molecules) and easily adsorbed on the inner wall of the nozzle 410. In addition, when the partial pressure of the TMA gas in the nozzle 401 is high, components in which the TMA molecules are decomposed (hereinafter, also be referred to as "TMA components") are combined (bonded) with each other before being supplied through the plurality of the gas supply holes 410a. As a result, the adsorption of the TMA component to the inner wall of 410 is further promoted. However, when the TMA gas is supplied, by limiting the TMA gas pressure in the nozzle 410 to 50 Pa or less, it is possible to lower the concentration of the TMA gas, and it is also possible to effectively suppress the self-decomposed components of the TMA gas from depositing on the inner wall of the nozzle 410. From the viewpoint of suppressing the deposition on the inner wall of the nozzle 410 due to the bonding between the TMA components, the TMA gas pressure in the nozzle 410 is set to, preferably 45 Pa or less, and more preferably 30 Pa or less.

The concentration of the TMA gas is lowered as the TMA gas pressure in the nozzle 410 is lowered when the source gas is supplied. Therefore, the time (also referred to as a "film-forming time") and the number of the cycles required to form the film with the desired thickness on the wafer 20 are increased. As a result, the productivity may be reduced. From the viewpoint of obtaining a practical deposition rate (also referred to as a "film-forming rate"), the TMA gas pressure in the nozzle 410 in the source gas supplying step S106 is set to, preferably 10 Pa or more, and more preferably 20 Pa or more.

Although the TMA gas pressure in the nozzle 410 in the source gas supplying step S106 may vary according to conditions such as an inner diameter of the nozzle 410, the size and the number of the plurality of the gas supply holes 410a of the nozzle 410, for example, it is possible to control (adjust) the TMA gas pressure in the nozzle 410 by adjusting the flow rate of the TMA gas by the MFC 312. That is, the TMA gas pressure in the nozzle 410 tends to increase as the flow rate of the TMA gas supplied into the nozzle 410 increases, and the TMA gas pressure in the nozzle 410 tends to decrease as the flow rate of the TMA gas supplied into the nozzle 410 decreases. Preferably, the flow rate of the TMA gas may be controlled so that the TMA gas pressure in the nozzle 410 is set to 50 Pa or less.

For example, using the nozzle 41 provided with a pressure reducing hole below a lowermost gas supply hole of the plurality of the gas supply holes 410a, it is possible to limit the TMA gas pressure in the nozzle 410 to 50 Pa or less when the source gas is supplied.

In the source gas supplying step S106, the APC valve 243 is appropriately controlled to adjust the inner pressure of the process chamber 201 to a predetermined pressure. For example, the predetermined pressure of the process chamber 201 in the source gas supplying step S106 may range from 1 Pa to 1,000 Pa, preferably from 1 Pa to 100 Pa, and more preferably from 1 Pa to 50 Pa. By setting (adjusting) the inner pressure of the process chamber 201 to 1,000 Pa or less, it is possible to perform the first residual gas removing step S108 described later appropriately, and it is also possible to further suppress the self-decomposed components of the TMA gas from depositing on the inner wall of the nozzle 410. By setting the inner pressure of the process chamber 201 to 1 Pa or more, it is possible to increase a reaction rate of the TMA gas on a surface of the wafer 200, and it is also possible to obtain the practical film-forming rate.

(iii) Inner Temperature of the Process Chamber in the Source Gas Supplying Step: 500° C. or Less The heater 207 heats the process chamber 201 such that the inner temperature of the process chamber 201 reaches a process temperature which is set to 500° C. or less. When the film is formed with the process temperature suppressed to 500° C. or less, it is possible to further suppress the excessive thermal decomposition of the TMA gas, and it is also possible to further suppress the adhesion of the TMA components, generated by the decomposition of the TMA gas, to the inner wall of the nozzle 410. As a result, it is possible to extend a maintenance cycle of the nozzle 410. From the viewpoint of suppressing the excessive thermal decomposition of the TMA gas, the process temperature is set to, preferably 500° C. or less. In addition, from the viewpoint of efficiently forming the film, the process temperature is set to, preferably 200° C. or more, more preferably 400° C. or more. By setting the process temperature to 400° C. or more, it is possible to form the film with a high efficiency and a high reactivity.

By supplying the TMA gas into the process chamber 201 according to the above-described processing conditions, an aluminum-containing layer is formed on a top surface (outermost surface) of the wafer 200. The aluminum-containing layer may contain carbon (C) and hydrogen (H) in addition to aluminum (Al). The aluminum-containing layer may be formed by physical adsorption of the TMA on the top surface of the wafer 200, by chemical adsorption of substances generated by decomposing a part of the TMA on the top surface of the wafer 200, or by the deposition of aluminum generated by thermal decomposition of the TMA on the top surface of the wafer 200. That is, the aluminum-containing layer may be an adsorption layer (physical adsorption layer or chemical adsorption layer) of the TMA or substances generated by decomposing a part of the TMA, or may be an aluminum deposition layer (aluminum layer).

First Residual Gas Removing Step S108

After the aluminum-containing layer is formed, the valve 314 is closed to stop the supply of the TMA gas. In the first residual gas removing step S108, with the APC valve 243 open, the vacuum pump 246 vacuum-exhausts the inner atmosphere of the process chamber 201 to remove a residual TMA gas in the process chamber 201 which did not react or which contributed to the formation of the aluminum-containing layer from the process chamber 201. In the first residual gas removing step S108, by opening the valves 514 and 524, the $N_2$ gas is supplied into the process chamber 201. Alternatively, when the valve 514 is already opened and the $N_2$ gas is supplied as the mixed gas with the TMA gas into the process chamber 201 in the source gas supplying step S106, the valve 524 is opened to supply the $N_2$ gas into the process chamber 201. The $N_2$ gas serves as a purge gas, which improves the efficiency of removing the residual TMA gas which did not react or which contributed to the formation of the aluminum-containing layer from the process chamber 201. In the first residual gas removing step S108, the $N_2$ gas through the valves 514 and 524 may be continuously supplied or may be intermittently (that is, in a pulse-wise manner) supplied.

In the first residual gas removing step S108, it is not necessary to completely discharge the gas remaining in the process chamber 201 and to completely purge the process chamber 201. A small amount of the gas remaining in the process chamber 201 does not adversely affect the subsequent step (that is, the reactive gas supplying step S110). Therefore, it is not necessary to supply the $N_2$ gas (that is, the inert gas) at a large flow rate into the process chamber 201. The purge may be performed by supplying the $N_2$ gas of an amount equal to a volume of the reaction tube 203 (that is, a volume of the process chamber 201) such that the subsequent step will not be adversely affected. By not completely purging the inside of the process chamber 201, it is possible to shorten the time (also referred to as a "purging time") required to purge the process chamber 201, and to improve the throughput. It is also possible to reduce the consumption of the $N_2$ gas to the minimum.

Reactive Gas Supplying Step S110

After the residual gas such as the residual TMA gas is removed from the process chamber 201, the valves 514 and 524 are closed and the valve 324 is opened to supply the $O_3$ gas serving as the reactive gas into the gas supply pipe 320. After the flow rate of the $O_3$ gas is adjusted by the MFC 322, the $O_3$ gas is supplied onto the plurality of the wafers including the wafer 200 accommodated in the process chamber 201 through the plurality of the gas supply holes 420a of the nozzle 420. That is, the wafer 200 is exposed to the $O_3$ gas. The $O_3$ gas supplied through the plurality of the gas supply holes 420a passes through the inside of the process chamber 201, and is exhausted through the exhaust pipe 231. Alternatively, in the reactive gas supplying step S110, the valve 514 may not be closed and the flow rate of the $N_2$ gas may be adjusted by the MFC 512 to reduce the flow rate of the $N_2$ gas supplied into the gas supply pipe 310. By supplying the $N_2$ gas into the process chamber 201 through the gas supply pipe 310 and the plurality of the gas supply holes 410a of the nozzle 410, it is possible to prevent the $O_3$ gas from entering (flowing backward) into the nozzle 410.

In the reactive gas supplying step S110, the APC valve 243 is appropriately controlled to adjust the inner pressure of the process chamber 201 to a predetermined pressure. For example, the predetermined pressure of the process chamber 201 in the reactive gas supplying step S110 may range from 1 Pa to 1,000 Pa, preferably from 50 Pa to 500 Pa, and more preferably from 50 Pa to 200 Pa. The flow rate of the $O_3$ gas supplied into the process chamber 201 is adjusted by the MFC 322 to a predetermined flow rate. For example, the predetermined flow rate of the $O_3$ gas in the reactive gas supplying step S110 may range from 5 slm to 40 slm, preferably from 5 slm to 30 slm, and more preferably from 10 slm to 20 slm. The time duration (supply time) of supplying the $O_3$ gas onto the wafer 200 may be set to a predetermined time. For example, the predetermined time may range from 1 second to 120 seconds, preferably from 5 seconds to 90 seconds, and more preferably from 10 seconds to 60 seconds.

The reactive gas supplying step S110 differs from the source gas supplying step S106 in that the $O_3$ gas is supplied through the plurality of the gas supply holes 420a of the reactive gas nozzle 420 in the reactive gas supplying step S110 while the TMA gas is supplied through the plurality of the gas supply holes 410a of the source gas nozzle 410 in the source gas supplying step S106. Therefore, in the reactive gas supplying step S110, for example, the processing conditions (for example, the process temperature) other than the supply of the $O_3$ gas through the plurality of the gas supply holes 420a of the reactive gas nozzle 420 may be set to the same conditions as the source gas supplying step S106.

The $O_3$ gas supplied into the process chamber 201 reacts with at least a part (portion) of the aluminum-containing layer formed on the wafer 200 in the source gas supplying step S106. The aluminum-containing layer is oxidized to form an aluminum oxide layer (also referred to as an "AlO layer") containing aluminum (Al) and oxygen (O) serving as a metal oxide layer. That is, the aluminum-containing layer is modified into the aluminum oxide layer.

Second Residual Gas Removing Step S112

After the aluminum oxide layer (AlO layer) is formed, the valve 324 is closed to stop the supply of the $O_3$ gas. In the second residual gas removing step, S112, with the APC valve 243 open, the vacuum pump 246 vacuum-exhausts the inner atmosphere of the process chamber 201 to remove a residual $O_3$ gas in the process chamber 201 which did not undergo chemical reactions or contributed to the formation of the AlO layer or the reaction by-products from the process chamber 201. By opening the valves 514 and 524, the $N_2$ gas is supplied into the process chamber 201 through the plurality of the gas supply holes 410a and the plurality of the gas supply holes 420a, which are provided in the nozzle 410 and the nozzle 420, respectively. In the second residual gas removing step S112, for example, an amount (also referred to as a "supply amount") of the $N_2$ gas supplied into the process chamber 201 may be set to the same amount (supply amount) as the first residual gas removing step S108. By supplying the $N_2$ gas into the process chamber 201 through the plurality of the gas supply holes 410a and the plurality of the gas supply holes 420a, it is possible to improve the efficiency of removing the residual $O_3$ gas in the process chamber 201 which did not undergo chemical reactions or contributed to the formation of the AlO layer or the reaction by-products from the process chamber 201. Similar to the first residual gas removing step S108, it is not necessary to completely remove the residual $O_3$ gas or the reaction by-products remaining in the process chamber 201.

(iv) The Number of the Cycles Performed Continuously for Forming the Film on the Substrate: 100 or Less By continuously performing the cycle wherein the source gas supplying step S106, the first residual gas removing step S108, the reactive gas supplying step S110 and the second residual gas removing step S112 are performed in this order a predetermined number of times (at least once), an aluminum oxide film (also referred to as an "ALO film") is formed with a desired thickness on the wafer 200. The number of the cycles (hereinafter, also referred to as a "continuous cycle number") performed continuously for forming the ALO film on each of the plurality of the wafers including the wafer (substrate) 200 in one batch process is appropriately selected according to the desired thickness of the finally formed ALO film under the condition that a thickness of the ALO layer formed in each cycle is thinner than the desired thickness. According to the embodiments, for example, the number of the cycles performed continuously is limited to 100 cycles or less. As described above, in the source gas supplying step S106 in each cycle, by limiting the supply time of the source gas to 20 seconds or less, the pressure of the source gas in the source gas nozzle 410 to 50 Pa or less and the process temperature to 500° C. or less, it is possible to suppress the TMA components from adhering to the inner wall of the nozzle 410. However, as the number of the cycles (continuous cycle number) in one batch process increases, the TMA components tend to adhere to the inner wall of the nozzle 410. According to the embodiments, by limiting the continuous cycle number to 100 cycles or less, it is possible to more effectively suppress the TMA components from adhering to the inner wall of the nozzle 410.

For example, the thickness (film thickness) of the AlO film formed on the surface of the wafer 200 may range from 0.1 nm to 100 nm, preferably from 0.1 nm to 10 nm, and more preferably from 1 nm to 5 nm.

Purging and Returning to Atmospheric Pressure Step S116

After the film-forming step is completed, that is, the cycle is performed the predetermined number of times ("YES" in S114 of FIG. 10), the valves 514 and 524 are opened. The $N_2$ gas serving as the purge gas is supplied into the process chamber 201 through each of the gas supply pipes 310 and 320, and then the $N_2$ gas supplied into the process chamber 201 is exhausted through the exhaust pipe 231. The inner atmosphere of the process chamber 201 is purged with the $N_2$ gas, thus the gas remaining in the process chamber 201 or the reaction by-products remaining in the process chamber 201 are removed from the process chamber 201 (purging step). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure step).

Boat Unloading and Wafer Discharging Step S118

Thereafter, the seal cap 209 is lowered by the boat elevator 115 and the lower end opening of the manifold 209 is opened. The boat 217 with the plurality of processed wafers including the wafer 200 charged therein is unloaded out of the reaction tube 203 through the lower end opening of the manifold 209 (boat unloading step). After the boat 217 is unloaded, the shutter 219s is moved. The lower end opening of the manifold 209 is sealed by the shutter 219s through the O-ring 220c (shutter closing step). Then, the plurality of the processed wafers including the wafer 200 is discharged (transferred) from the boat 217 (wafer discharging step).

Number of Times of Substrate Processing Performed Continuously: 4 or Less

In the source gas supplying step S106 in each cycle in the method of manufacturing the semiconductor device according to the embodiments as described above, it is possible to suppress the TMA components generated by decomposing the TMA gas from adhering to the inner wall of the nozzle 410 by limiting: (i) the supply time of the source gas to 20 seconds or less; (ii) the pressure of the source gas in the source gas nozzle 410 to 50 Pa or less; (iii) the process temperature to 500° C. or less; and (iv) the number of cycles performed continuously to 100 cycles or less. As a result, it is possible to suppress the deposits in the nozzle 410 from being peeled off to generate the particles (that is, generate dusts) which might cause the particles to adhere to the wafer 200 accommodated in the process chamber 201 and be added into the film as the impurities. In addition, it is possible to extend the maintenance cycle of the nozzle 410.

After the film is formed by the substrate processing while satisfying the above conditions (i) through (iv), the boat 217 with the plurality of processed wafers including the wafer 200 charged therein is unloaded out of the reaction tube 203. Then, a boat with a plurality of wafers including a wafer 200 to be processed next is loaded into the process chamber 201, and the substrate processing may be performed continuously. However, when the substrate processing is performed continuously and repeatedly, the TMA components generated by the self-decomposition of the TMA gas may easily adhere to the inner wall of the nozzle 410. Therefore, referring to FIG. 10, it is preferable to limit the number of times that the substrate (wafer 200) is continuously processed (also referred to as "the number of times of the substrate processing performed continuously") to 4 or less. By limiting the number of times of the substrate processing performed continuously to 4 or less, it is possible to further extend the maintenance cycle of the nozzle 410.

Second Embodiment

Figure 4:
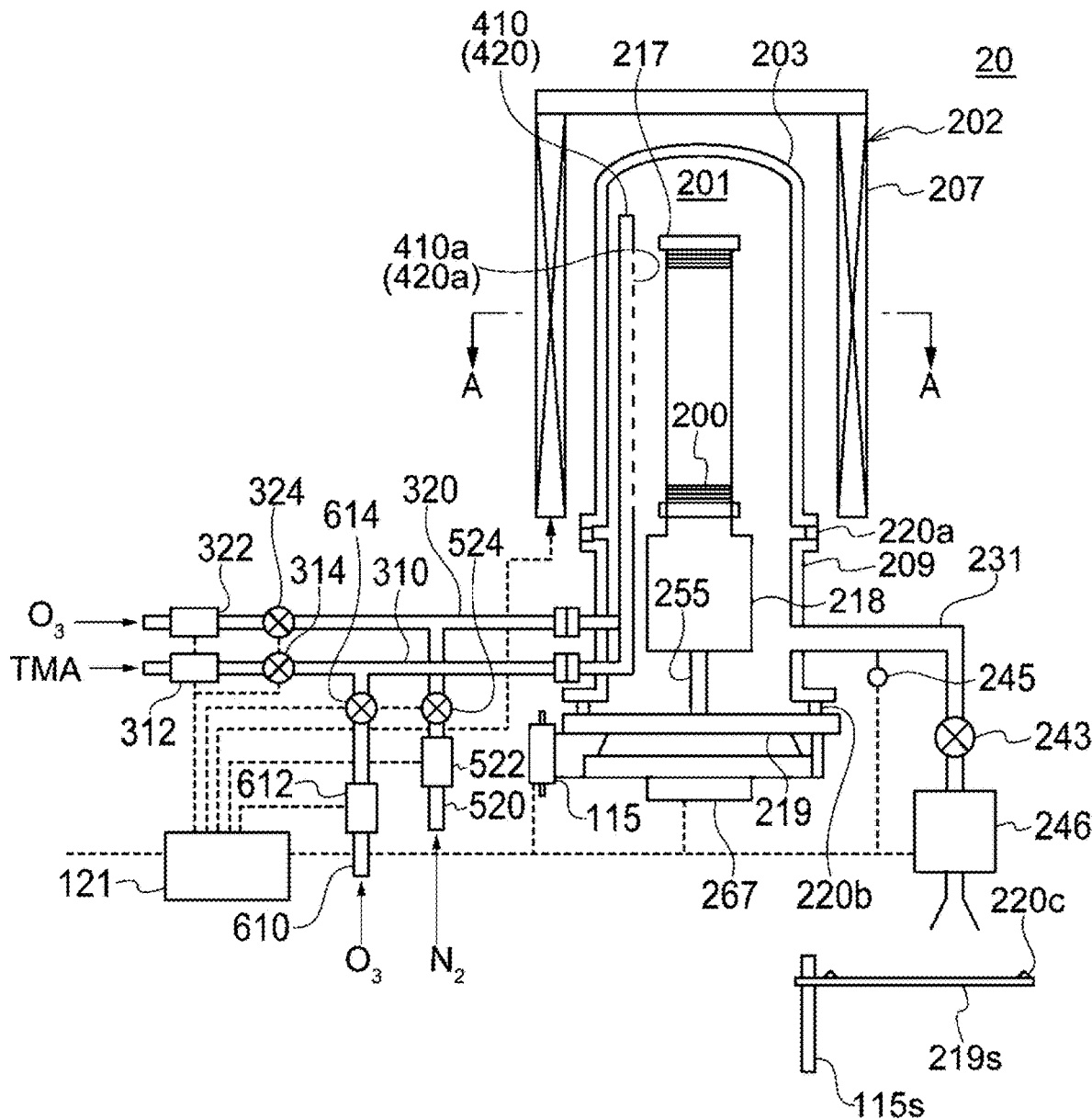
FIG. 4 schematically illustrates a vertical cross-section of a vertical type process furnace of a substrate processing apparatus preferably used in a second embodiment described herein.

FIG. 4 schematically illustrates a vertical cross-section of a vertical type process furnace 202 of a substrate processing apparatus 20 preferably used in a second embodiment described herein. In the substrate processing apparatus 20 according to the second embodiment described herein, a gas supply pipe 610 configured to supply the reactive gas is connected to the gas supply pipe 310 configured to supply the source gas. The gas supply pipe 610 is provided separately from the gas supply pipe 320 communicating with the nozzle 420 configured to supply the reactive gas. A mass flow controller (MFC) 612 and a valve 614 are sequentially installed at the gas supply pipe 610 from an upstream side to a downstream side of the gas supply pipe 610 at an upstream side of a connection portion (also referred to as a "confluent portion") connected with the gas supply pipe 310. Instead of the gas supply pipe 510 provided with the MFC 512 and the valve 514 serving as the gas supply line configured to supply the inert gas through the gas supply pipe 310 in the substrate processing apparatus 10 shown in FIG. 1, the substrate processing apparatus 20 according to the second embodiment includes the gas supply pipe 610 provided with the MFC 612 and the valve 614 serving as a gas supply line configured to supply the reactive gas through the gas supply pipe 310. The other components of the substrate processing apparatus 20 according to the second embodiment are the same as those of the substrate processing apparatus 10 according to the first embodiment.

When the method of manufacturing the semiconductor device according to the embodiments is performed using the substrate processing apparatus 20 described above, by supplying the ozone ($O_3$) gas into the source gas nozzle 410 before the reactive gas supplying step S110 and after the source gas supplying step S106, the inner wall of the source gas nozzle 410 with an AlO film can be pre-coated. In the source gas supplying step S106 according to the second embodiment, the valve 314 is opened to supply the TMA gas into the gas supply pipe 310. Then, the TMA gas is supplied into the process chamber 201 through the plurality of the gas supply holes 410a of the nozzle 410. In the source gas supplying step S106 according to the second embodiment, the valve 614 configured to supply the $O_3$ gas is closed. Similar to the first embodiment, in the source gas supplying step S106 according to the second embodiment, (i) the supply time of the source gas is limited to 20 seconds or less, (ii) the pressure of the source gas in the source gas nozzle 410 is limited to 50 Pa or less, (iii) the process temperature is limited to 500° C. or less and (iv) the number of the cycles performed continuously is limited to 100 cycles or less.

Then, when stopping the source gas supplying step S106, the valve 314 is closed to stop the supply of the TMA gas into the nozzle 410, and then the valve 614 is opened to supply the $O_3$ gas into the gas supply pipe 310. The $O_3$ gas with the flow rate thereof adjusted by the MFC 612 is supplied into the nozzle 410. In the source gas supplying step S106 according to the second embodiment, the flow rate of the $O_3$ gas supplied into the nozzle 410 is adjusted to a predetermined flow rate. For example, the predetermined flow rate of the $O_3$ gas may range from 5 slm to 30 slm. By supplying the $O_3$ gas into the nozzle 410 and reacting the $O_3$ gas with the TMA gas remaining in the nozzle 410, the inner wall of the nozzle 410 is pre-coated with the AlO film generated by chemical reaction between the TMA gas and the $O_3$ gas. Thus, by supplying the $O_3$ gas into the nozzle 410 through the gas supply pipe 610 provided separately from the gas supply pipe 420 and pre-coating the inner wall of the nozzle 410 with the AlO film, it is possible to effectively suppress the TMA components from adhering to the inner wall of the nozzle 410.

For example, the processing conditions of the steps performed after the source gas supplying step S106 (that is, the first residual gas removing step S108, the reactive gas supplying step S110 and the second residual gas removing step S112) of the second embodiment may be set to the same conditions as those of the first embodiment.

Third Embodiment

Figure 5:
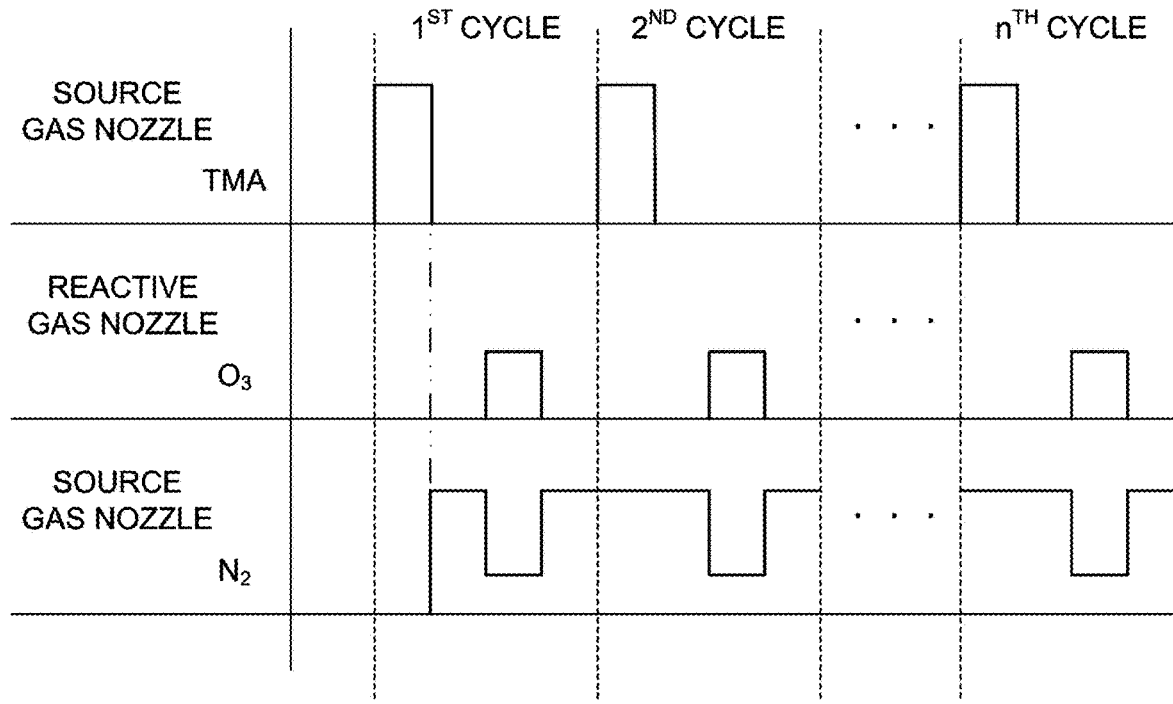
FIG. 5 schematically illustrates an exemplary film-forming sequence according to a third embodiment described herein.

FIG. 5 schematically illustrates an exemplary film-forming sequence according to a third embodiment described herein. The third embodiment may be implemented using the substrate processing apparatus 10 provided with the configuration shown in FIG. 1. In the third embodiment, the source gas supplying step S106 and the first residual gas removing step S108 are performed in the same manner as the source gas supplying step S106 and the first residual gas removing step S108 of the first embodiment, respectively. That is, in the first residual gas removing step S108 performed after the source gas supplying step S106, as in the first embodiment, the valves 514 and 524 are opened to supply the $N_2$ gas into the process chamber 201 through the gas supply pipes 310 and 320 and the nozzles 410 and 420. When shifting from the first residual gas removing step S108 to the reactive gas supplying step S110, the valve 524 is closed and the supply of the $N_2$ gas through the nozzle 420 is stopped, but the valve 514 is not closed and the supply of the $N_2$ gas through the nozzle 410 is continued. Then, in the reactive gas supplying step S110, the flow rate of the $N_2$ gas is adjusted by the MFC 512, and as shown in FIG. 5 such that the flow rate of the $N_2$ gas supplied into the gas supply pipe 310 is reduced. Although the $O_3$ gas is supplied through the plurality of the gas supply holes 420a of the nozzle 420 into the process chamber 201, the $N_2$ gas is supplied through the plurality of the gas supply holes 410a of the nozzle 410 into the process chamber 201 through the gas supply pipe 310. By supplying the $N_2$ gas through the plurality of the gas supply holes 410a of the nozzle 410, it is possible to adjust an amount of the $O_3$ gas entering (flowing backward) into the nozzle 410 through the plurality of the gas supply holes 410a. Alternatively, in the reactive gas supplying step S110, the valve 514 may also be closed to periodically stop the supply of the $N_2$ gas. When the valve 514 is closed in the reactive gas supplying step S110 to stop the supply of the $N_2$ gas, the $O_3$ gas supplied into the process chamber 201 may enter (flow backward) into the nozzle 410 through the plurality of the gas supply holes 410a.

According to the third embodiment, as shown in FIG. 9, the reactive gas supplying step S110 may include a backflow step. In the backflow step, a ratio of the flow rate of the $N_2$ gas supplied into (flowing into) the nozzle 410 through the gas supply pipes 510 and 310 (also referred to as the $N_2$ gas for adjusting a backflow) to the flow rate of the $O_3$ gas flowing backward from the process chamber 201 (also referred to as the backflow $O_3$ gas) is adjusted. From the viewpoint of facilitating the backflow, the flow rate of the backflow $O_3$ gas is adjusted to a predetermined flow rate. For example, preferably, the flow rate of the backflow $O_3$ gas may range from 1 slm to 50 slm, and more preferably from 10 slm to 30 slm. In the backflow step, the flow rate of the $N_2$ gas for adjusting the backflow in the nozzle 410 is adjusted to be lower than that of the backflow $O_3$ gas, or the supply of the $N_2$ gas for adjusting the backflow is stopped. Thereby, the backflow $O_3$ gas is supplied into the nozzle 410 by the pressure equalization in the process chamber 201. According to the backflow step, the TMA gas remaining in the source gas nozzle 410 in the reactive gas supplying step S110 and the backflow $O_3$ gas react with each other in the source gas nozzle 410. By causing the TMA gas remaining in the source gas nozzle 410 in the reactive gas supplying step S110 to react with the backflow $O_3$ gas to pre-coat the inner wall of the nozzle 410 with the ALO film, it is possible to effectively suppress the TMA components from adhering to the inner wall of the nozzle 410.

Fourth Embodiment

Figure 6:
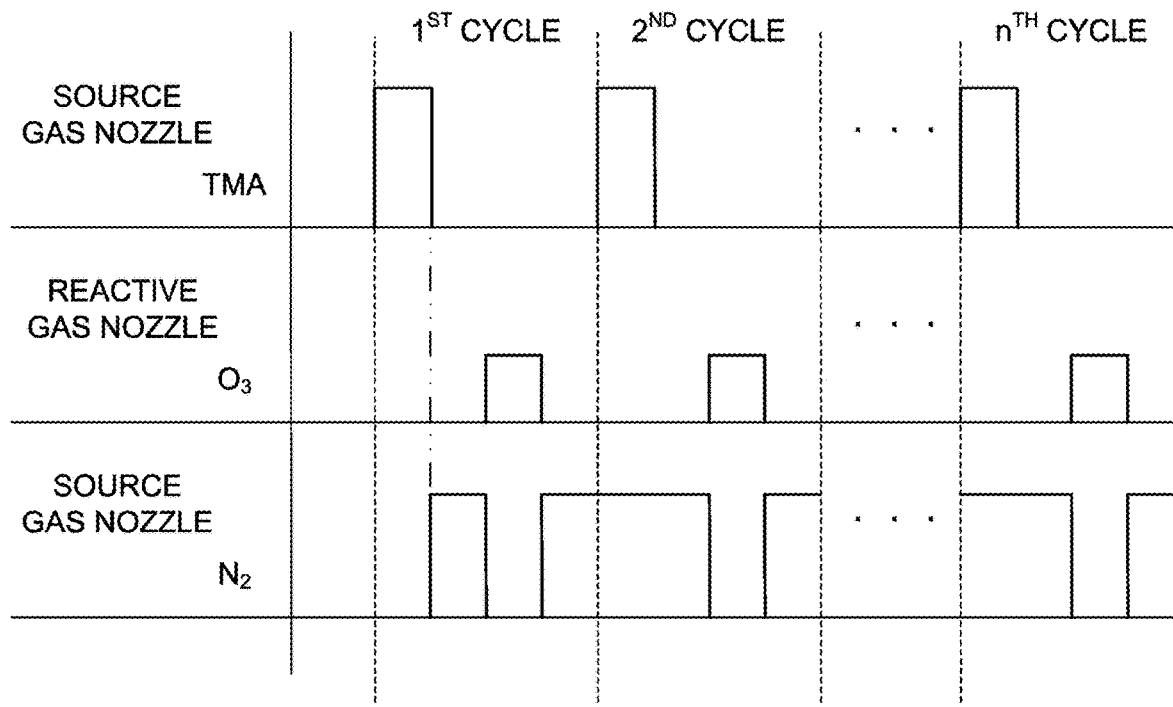
FIG. 6 schematically illustrates an exemplary film-forming sequence according to a fourth embodiment described herein.

FIG. 6 schematically illustrates an exemplary film-forming sequence according to a fourth embodiment described herein. The fourth embodiment is a modified example of the third embodiment. In the first residual gas removing step S108 in each cycle according to the fourth embodiment, the valve 514 is closed to stop the supply of the $N_2$ gas through the nozzle 410 into the process chamber 201. The fourth embodiment may be implemented using the substrate processing apparatus 10 of the configuration shown in FIG. 1. In the fourth embodiment, the source gas supplying step S106 and the first residual gas removing step S108 are performed in the same manner as the source gas supplying step S106 and the first residual gas removing step S108 of the first embodiment, respectively. When shifting from the first residual gas removing step S108 to the reactive gas supplying step S110, the valve 324 is opened to supply the $O_3$ gas into the gas supply pipe 320 such that the $O_3$ gas supplied into the gas supply pipe 320 is supplied into the process chamber 201 through the plurality of the gas supply holes 420a of the nozzle 420, and the valves 514 and 524 are closed to stop the supply of the $N_2$ gas into the process chamber 201 through the nozzle 410. As a result, the $O_3$ gas supplied into the process chamber 201 enters (flows backward) into the nozzle 410 through the plurality of the gas supply holes 410a. According to the fourth embodiment, by reacting the TMA components remaining in the nozzle 410 with the $O_3$ gas flowing backward and pre-coating the inner wall of the nozzle 410 with the ALO film generated by chemical reaction between the TMA components and the $O_3$ gas, it is possible to effectively suppress the TMA components from adhering to the inner wall of the nozzle 410.

Other Embodiments

While the technique is described by way of the above-described embodiments, the above-described technique is not limited thereto. The above-described technique may be modified in various ways without departing from the gist thereof.

For example, while the embodiments are described by way of an example in which the TMA gas serving as the aluminum-containing gas is used as the source gas, the above-described technique is not limited thereto. For example, a gas such as aluminum chloride ($AlCl_3$) gas may be used as the source gas. While the embodiments are described by way of an example in which the $N_2$ gas is used as the inert gas, the above-described technique is not limited thereto. For example, instead of the $N_2$ gas, a rare gas such as argon (Ar) gas, helium (He) gas, neon (Ne) gas and xenon (Xe) gas may be used as the inert gas.

For example, while the embodiments are described by way of an example in which the AlO film is formed on the wafer (substrate), the above-described technique is not limited thereto. For example, the above-described technique may be preferably applied to form on the wafer an adhesive film such that the gas such as the source gas is self-decomposed in the nozzle at the process temperature and deposited as the deposits on the inner wall of the nozzle and the deposits are peeled off in the film-forming step in the cycle. In addition, the above-described technique may be preferably applied to form a film on the wafer using the source gas diluted with a gas such as the inert gas by supplying such gas simultaneously with the source gas. For example, the above-described technique may be preferably applied to form on the wafer a film containing at least one element among titanium (Ti), zirconium (Zr), hafnium (Hf), tantalum (Ta), niobium (Nb), molybdenum (Mo), tungsten (W), yttrium (Y), lanthanum (La), strontium (Sr) and silicon (Si). That is, the above-described technique may be preferably applied to form on the wafer the film such as a nitride film, a carbonitride film, an oxide film, an oxycarbide film, an oxynitride film, an oxycarbonitride film, a boronitride film, a borocarbonitride film and a metal element film, which contains at least one element described above.

Preferably, the recipe (process recipe) (that is, a program defining parameters such as the process sequences and the processing conditions of the substrate processing) used to form the above-described various films is prepared individually according to the contents of the substrate processing such as the type of the film to be formed or to be removed, the composition ratio of the film, the quality of the film, the thickness of the film, the process sequences and the processing conditions of the substrate processing. Preferably, a plurality of process recipes is stored in the memory device 121c in advance via an electric communication line or the external memory device 123 storing the plurality of the process recipes. When starting the substrate processing, the CPU 121a preferably selects an appropriate process recipe among the plurality of the process recipes according to the contents of the substrate processing. Thus, it is possible to form plural kinds of films having various types, composition ratios, different qualities and thicknesses by only a single substrate processing apparatus in a universal and highly reproducible manner. In addition, it is possible to reduce the burden of an operator, and to start the substrate processing promptly without an operation mistake.

The above-described process recipes are not limited to newly created process recipes. For example, an existing process recipe which is already installed in the substrate processing apparatus may be changed to a new process recipe. When a process recipe is to be changed, the process recipe may be installed in the substrate processing apparatus through an electrical communication line or a recording medium having the process recipe written therein. The input/output device 122 installed in the existing substrate processing apparatus may be operated to directly change the existing process recipe which is already installed in the substrate processing apparatus to the new process recipe.

The above-described embodiments and the modified examples may be appropriately combined. The processing sequences and the processing conditions of the combinations may be substantially the same as those of the above-described embodiments.

EXPERIMENTAL EXAMPLES

While the technique will be described by way of experimental examples described below, the above-described technique is not limited thereto.

Using the substrate processing apparatus 10 with the configuration shown in FIG. 1, an AlO film is formed on the surface of the wafer by alternately performing the step of supplying the TMA gas serving as the source gas (that is, the source gas supplying step S106 described above) and the step of supplying the $O_3$ gas serving as the reactive gas (that is, the reactive gas supplying step S110 described above). By variously changing the film-forming conditions such as the supply time of the source gas in one cycle, the inner pressure of the source gas nozzle, the number of the cycles performed continuously, the number of times that the substrate processing is performed continuously and the process temperature, the ALO film is formed. In addition, a relationship between the film-forming conditions and an amount of the deposits adhered to the inner wall of the nozzle (that is, the source gas nozzle) configured to supply the source gas is considered.

Influence of Process Temperature, Supply Time of Source Gas, Pressure of Source Gas in Source Gas Nozzle The film (ALO film) is formed by setting the amount of the source gas supplied in the source gas supplying step S106 to 200 sccm and the process temperature to 500° C. and changing the supply time of the source gas in one cycle and the pressure of the source gas in the source gas nozzle. In addition, in order to adjust the partial pressure of the source gas in the source gas nozzle, the $N_2$ gas is supplied into the gas supply pipe together with the source gas to supply the mixed gas of the source gas and the $N_2$ gas. By adjusting the flow rate of the $N_2$ gas, the inner pressure of the source gas nozzle (that is, the partial pressure of the source gas) is adjusted. In addition, the inner pressure at the lowermost portion of the nozzle where the deposits are most likely to adhere is measured as the inner pressure of the source gas nozzle.

Figure 7:
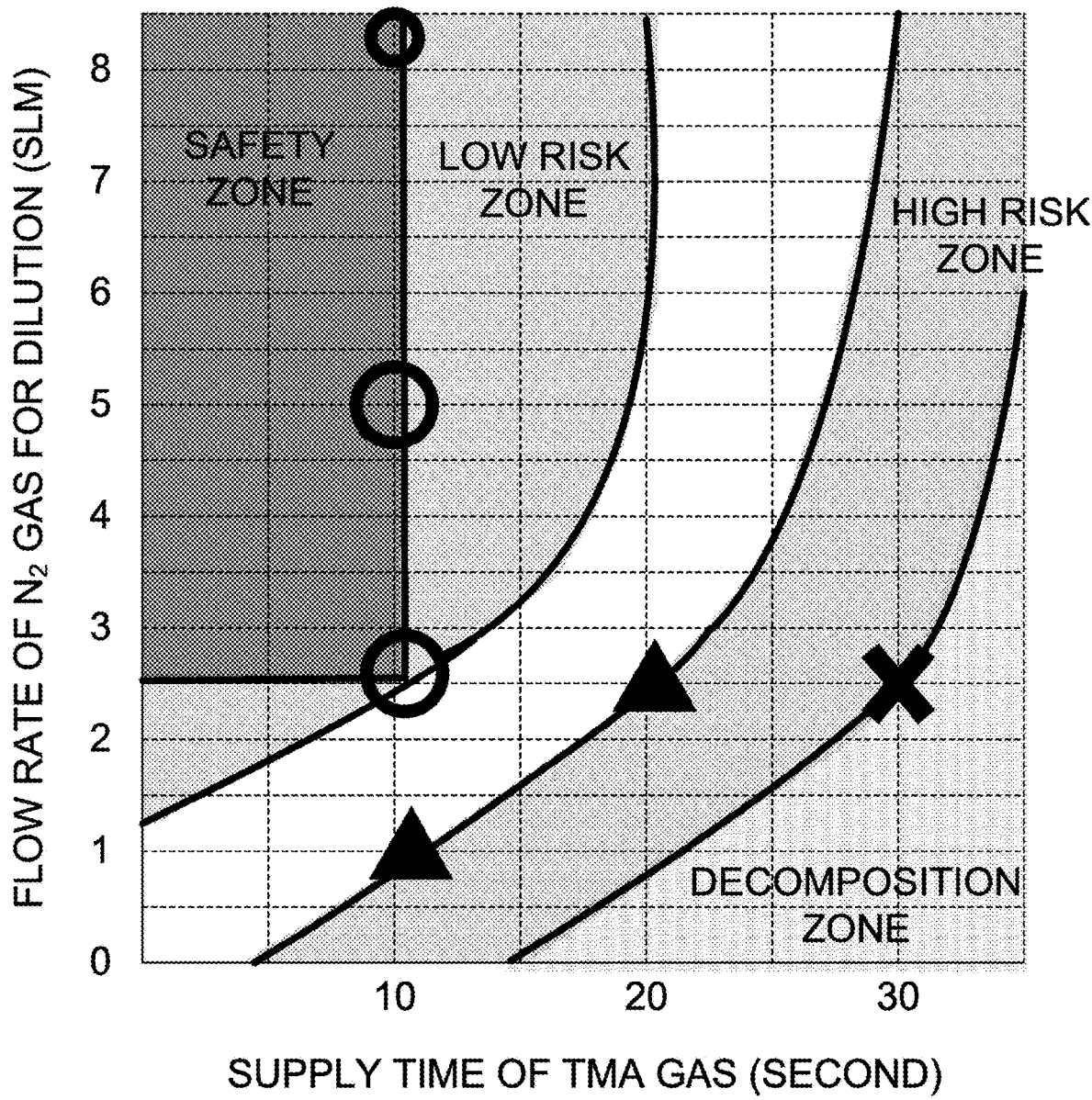
FIG. 7 schematically illustrates a relationship between a supply time of a source gas in a source gas supplying step, a flow rate of an inert gas for dilution in the source gas supplying step and the blackening of an inner wall of a source gas nozzle due to deposits.

FIG. 7 schematically illustrates a relationship between the supply time of the source gas in the source gas supplying step S106, the flow rate of the inert gas for dilution in the source gas supplying step S106 and the blackening of the inner wall of the source gas nozzle due to the deposits under the following conditions: the process temperature: 500° C.; and the supply amount of the TMA gas: 200 sccm.

The $N_2$ gas is mixed with the TMA gas and is supplied to the source gas nozzle. As the supply time of the source gas to the source gas nozzle increases and as the pressure of the source gas in the source gas nozzle increases, the amount of the deposits on the inner wall of the nozzle due to the decomposition of the source gas in the nozzle tends to increase. From the experimental results when the process temperature is 500° C. or less, it is confirmed that it is possible to effectively suppress the amount of the deposits adhered to the inner wall of the source gas nozzle due to the self-decomposition of the source gas by limiting the supply time of the source gas in each cycle to 20 seconds or less and the partial pressure of the TMA gas (source gas) in the source gas nozzle to 50 Pa or less.

Influence of Supply Time of Source Gas, The Number of Cycles Performed Continuously, The Number of Times of Substrate Processing Performed Continuously The film (AlO film) is formed by setting the process temperature to 500° C., the amount of the source gas supplied in the source gas supplying step S106 to 200 sccm and the partial pressure of the $N_2$ gas in the source gas nozzle to 50 Pa and changing the supply time of the source gas in one cycle and the number of the cycles performed continuously. In addition, after the film-forming process (substrate processing) is completed, a new wafer is transferred into the process chamber and the substrate processing is performed continuously to evaluate the amount of the deposits (that is, the degree of coloring or blackening) adhered to the source gas nozzle. FIG. 8 schematically illustrates a relationship between the supply time of the source gas supplied through the source gas nozzle in the source gas supplying step S106, the number of the cycles performed continuously, the number of the times that the substrate processing is performed continuously and the blackening of the inner wall of the source gas nozzle due to the deposits. When the film-forming process is performed with the supply time of the source gas of 9 seconds, no blackening of the source gas nozzle is observed until 100 cycles. In addition, even when the substrate processing is performed four times continuously, no blackening of the source gas nozzle is observed. When the film-forming process is performed with the supply time of the source gas of 11 seconds, no blackening of the source gas nozzle is observed until 100 cycles.

While the technique is described by way of the above-described embodiments and the experimental examples, the above-described technique is not limited thereto. The above-described embodiments and the modified examples may be appropriately combined.

As described above, according to some embodiments in the present disclosure, it is possible to provide a technique capable of suppressing deposits, generated by decomposing a gas such as a source gas and a reactive gas, from adhering to an inner wall of a nozzle through which the source gas is supplied when the source gas and the reactive gas are alternately supplied to a plurality of substrates to form a film thereon.

What is claimed is:

1. A method of manufacturing a semiconductor device comprising:
    (a) supplying a source gas into a process chamber through a source gas nozzle while heating the process chamber in which a plurality of substrates is stacked, wherein the source gas nozzle extends along a stacking direction of the plurality of the substrates and is provided with a plurality of gas supply holes opened at positions corresponding to a stacking region of the plurality of the substrates; and (b) supplying a reactive gas capable of reacting with the source gas into the process chamber,
wherein a cycle, in which (a) and (b) are alternately performed one by one, is performed once or more to form a film on the plurality of the substrates while satisfying conditions comprising:
(i) a supply time of the source gas in (a) in each cycle is 20 seconds or less;
(ii) a pressure of the source gas in the source gas nozzle in (a) is 50 Pa or less;
(iii) an inner temperature of the process chamber in (a) is 500° C. or less; and
(iv) number of cycles performed continuously to form the film on the plurality of the substrates is 100 cycles or less.

2. The method of claim 1, wherein the reactive gas is supplied into the source gas nozzle after (a) is performed so that an inner wall of the source gas nozzle is pre-coated.

3. The method of claim 2, wherein a flow rate of the reactive gas is 30 slm or less.

4. The method of claim 1, wherein an inert gas is supplied into the source gas nozzle, and the reactive gas supplied into the process chamber flows backward into the source gas nozzle through the plurality of the gas supply holes of the source gas nozzle in (b).

5. The method of claim 4, wherein a ratio of a flow rate of the inert gas supplied into the source gas nozzle to a flow rate of the reactive gas flowing backward into the source gas nozzle is adjusted in (b).

6. The method of claim 1, wherein the reactive gas supplied into the process chamber flows backward into the source gas nozzle by stopping the supplying of the inert gas into the source gas nozzle in (b).

7. The method of claim 1, wherein an inert gas is supplied into the source gas nozzle in (b), and a flow rate of the inert gas supplied into the source gas nozzle is lower than a flow rate of the reactive gas flowing backward into the source gas nozzle in (b).

8. The method of claim 1, wherein the supply time of the source gas in (a) in each cycle is 2 seconds or more, the pressure of the source gas in the source gas nozzle in (a) is 10 Pa or more, the inner temperature of the process chamber in (a) is 400° C. or more, and the number of the cycles performed continuously to form the film on the plurality of the substrates is one or more.

9. The method of claim 1, wherein the source gas comprises a metal-containing gas and the reactive gas comprises an oxygen-containing gas.

* * * * *